(12) United States Patent
Kitamura et al.

(10) Patent No.: US 9,711,371 B2
(45) Date of Patent: Jul. 18, 2017

(54) METHOD OF ETCHING ORGANIC FILM

(71) Applicant: Tokyo Electron Limited, Tokyo (JP)

(72) Inventors: Akinori Kitamura, Miyagi (JP); Kosuke Kariu, Miyagi (JP); Toshihisa Ozu, Hwaseong-si (KR); Hai Woo Lee, Hwaseong-si (KR)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/926,079

(22) Filed: Oct. 29, 2015

(65) Prior Publication Data

US 2016/0126071 A1 May 5, 2016

(30) Foreign Application Priority Data

Oct. 31, 2014 (JP) .................. 2014-222543

(51) Int. Cl.
| | | |
|---|---|---|
| *H01L 21/311* | (2006.01) | |
| *H01J 37/32* | (2006.01) | |
| *H01L 21/3065* | (2006.01) | |
| *H01L 21/02* | (2006.01) | |
| *H01L 21/308* | (2006.01) | |

(Continued)

(52) U.S. Cl.
CPC .... *H01L 21/31138* (2013.01); *H01J 37/3222* (2013.01); *H01J 37/32192* (2013.01); *H01L 21/02071* (2013.01); *H01L 21/0271* (2013.01); *H01L 21/308* (2013.01); *H01L 21/3065* (2013.01); *H01L 21/31116* (2013.01); *H01L 21/31127* (2013.01); *H01L 21/31144* (2013.01); *H01L 21/32136* (2013.01); *H01J 2237/334* (2013.01); *H01J 2237/3341* (2013.01)

(58) Field of Classification Search
None
See application file for complete search history.

(56) References Cited

U.S. PATENT DOCUMENTS 6,551,938 B1 * 4/2003 Wu .................. G03F 7/075
257/E21.024
2004/0219797 A1 11/2004 Honda
(Continued)

FOREIGN PATENT DOCUMENTS

| | | |
|---|---|---|
| JP | 2001-358218 A | 12/2001 |
| JP | 2002-252222 A | 9/2002 |
| WO | 2013/157359 A1 | 10/2013 |

OTHER PUBLICATIONS

H. Xiao, Introduction to Semiconductor Manufacturing Technology, SPIE Press, 2012, ISBN 978-0-8194-9092-6, pp. 581-593.*

*Primary Examiner* — Jiong-Ping Lu
(74) *Attorney, Agent, or Firm* — Pearne & Gordon LLP

(57) ABSTRACT

An organic film can be etched while suppressing damage on an underlying layer. A method of etching the organic film includes etching the organic film within a processing vessel of a plasma processing apparatus which accommodates a processing target object. A processing gas containing a hydrogen gas and a nitrogen gas is supplied into the processing vessel, and plasma of the processing gas is generated. Further, a flow rate ratio of the hydrogen gas to a flow rate of the processing gas is set to be in a range from 35% to 75%, and a high frequency bias power for ion attraction to the processing target object is set to be in a range from 50 W to 135 W, in the etching of the organic film.

8 Claims, 8 Drawing Sheets

(51) Int. Cl.
*H01L 21/027* (2006.01)
*H01L 21/3213* (2006.01)

(56) References Cited

U.S. PATENT DOCUMENTS

2006/0213865 A1  9/2006  Honda
2013/0180660 A1* 7/2013  Nozawa ............ H01J 37/32192
                                          156/345.24
2015/0064924 A1  3/2015  Takaba

* cited by examiner

METHOD OF ETCHING ORGANIC FILM

CROSS-REFERENCE TO RELATED APPLICATION

This application claims the benefit of Japanese Patent Application No. 2014-222543 filed on Oct. 31, 2014, the entire disclosures of which are incorporated herein by reference.

TECHNICAL FIELD

The embodiments described herein pertain generally to a method of etching an organic film.

BACKGROUND

In the manufacture of an electronic device such as a semiconductor device, there has been conventionally employed a process of etching an etching target layer by exposing a processing target object to plasma which is generated by using a plasma processing apparatus.

As an example of the etching target layer, an organic film may be used, as disclosed in Japanese Patent Laid-open Publication No. 2001-358218 and Japanese Patent Laid-open Publication No. 2002-252222, for example. In the plasma etching described in these documents, plasma of a processing gas containing a nitrogen gas ($N_2$ gas) and a hydrogen gas ($H_2$ gas) is generated, and the organic film is etched by attracting ions to the processing target object with a bias power. That is, in this plasma etching, the organic film is etched mainly by using a physical impact of the ions on the organic film, i.e., by using a sputtering effect with the ions.

Patent Document 1: Japanese Patent Laid-open Publication No. 2001-358218

Patent Document 2: Japanese Patent Laid-open Publication No. 2002-252222

Meanwhile, in the plasma etching of the organic film, it may be required to suppress damage on an underlying layer of the organic film. According to the plasma etching method described in the aforementioned documents, however, it is difficult to suppress the damage on the underlying layer.

SUMMARY

In one exemplary embodiment, a method of etching an organic film includes preparing a processing target object having an underlying layer, an organic film formed on the underlying layer, and a resist mask which is formed on the organic film such that the organic film is partially exposed; and etching the organic film within a processing vessel of a plasma processing apparatus which accommodates the processing target object therein. Further, in the method of etching the organic film, a processing gas containing a hydrogen gas and a nitrogen gas is supplied into the processing vessel, and plasma of the processing gas is generated. Moreover, a flow rate ratio of the hydrogen gas to a flow rate of the processing gas is set to be in a range from 35% to 75%, and a high frequency bias power for ion attraction to the processing target object is set to be in a range from 50 W to 135 W in the etching of the organic film.

In the above-mentioned method, since the ratio of the hydrogen gas in the processing gas is set to be in the range from 35% to 75%, the organic film can be etched with a high selectivity against the underlying layer, and the organic film can be etched at a high etching rate. Thus, according to this method, it is possible to etch the organic film while suppressing damage on the underlying layer. In addition, the high frequency bias power for ion attraction to the processing target object is used, though the power level thereof is low. Accordingly, the etching of the organic film in a vertical direction can be accelerated, and the organic film can be etched at a high etching rate. Furthermore, since the high frequency bias power is a relatively low power level, a high selectivity of the etching of the organic film with respect to the underlying layer can be achieved. Therefore, it is possible to etch the organic film while suppressing the damage on the underlying layer.

Further, an internal pressure of the processing vessel may be set to be in a range from 6.666 Pa (50 mTorr) to 26.66 Pa (200 mTorr). In this high pressure environment, ion energy may be lowered. Thus, the damage on the underlying layer can be further suppressed.

Moreover, the underlying layer may include a metal film, by way of non-limiting example, titanium nitride, in contact with the organic film. Alternatively, the underlying layer may include a silicon-containing film in contact with the organic film. The processing target object may further have a base region provided with a plurality of protruding regions spaced apart from each other, and a surface of the base region may include surfaces of the plurality of protruding regions and bottom surfaces between the plurality of protruding regions, and the underlying layer may be formed on the surface of the base region. In the entire region of the organic film of this processing target object, in order to remove a region exposed through the mask by etching, the organic film that exists between adjacent protruding regions may need to be etched even after a part of the underlying layer extended from top portions of the protruding regions is exposed. Accordingly, a part of the underlying layer that is exposed first is kept being exposed to active species for a long time. According to the above-described method, however, the damage on the underlying layer can be suppressed even in the etching of the organic film of this processing target object.

The plasma may be generated by a surface wave propagating on a surface of a dielectric window which is in contact with a space within the processing vessel and arranged to face a mounting table configured to hold the processing target object thereon. The surface wave may be a microwave which is transmitted to the dielectric window from a radial line slot antenna. The organic film can be etched by radical-dominant active species, and, thus, the damage on the underlying layer can be further suppressed.

The organic film may be etched against the underlying layer with a selectivity of 74.

According to the exemplary embodiment, it is possible to suppress the damage on the underlying layer in the etching of the organic film.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
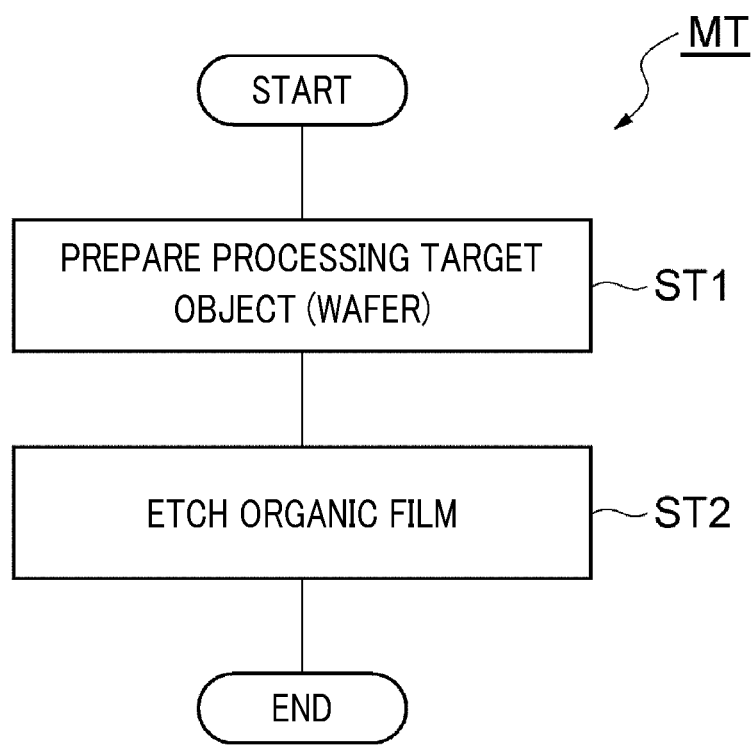
FIG. 1 is a flowchart for describing a method of etching an organic film according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

FIG. 1 is a flowchart for describing a method of etching an organic film according to an exemplary embodiment. The method MT shown in FIG. 1 is directed to a method of etching an organic film of a processing target object, and includes a process ST1 and a process ST2. At the process ST1, the processing target object is prepared.

Figure 2:
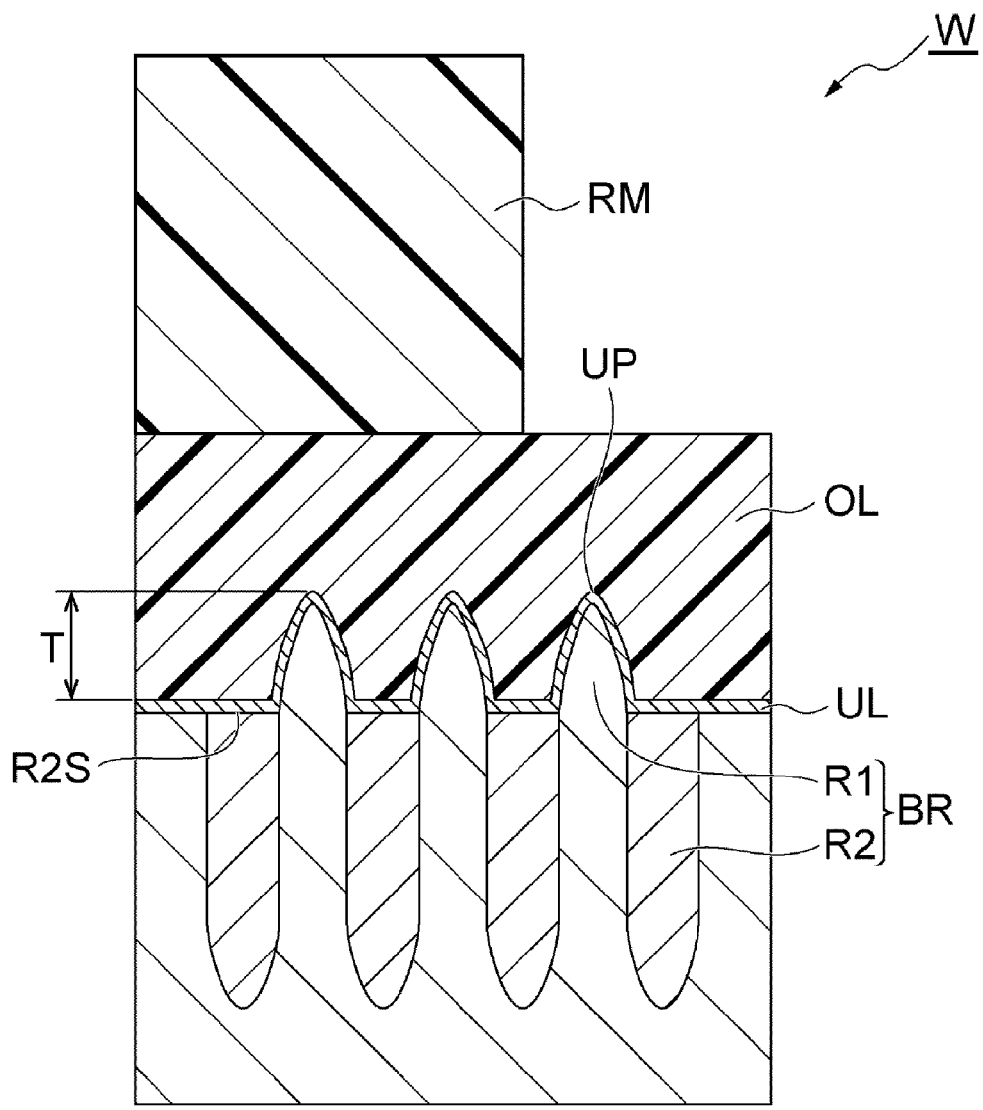
FIG. 2 is a cross sectional view illustrating an example processing target object.

FIG. 2 is a cross sectional view illustrating an example of the processing target object. A cross section of a wafer W as the example of the processing target object is partially depicted in FIG. 2. As shown in FIG. 2, the wafer W has an underlying layer UL, an organic film OL and a resist mask RM.

The underlying layer UL is a layer forming a base of the organic film OL. The underlying layer UL is formed of a single-layered film or a multi-layered film. The underlying layer UL may include a metal film in contact with the organic film OL. The metal film may be, by way of example, but not limitation, a titanium nitride (TiN) film. Specifically, the metal film in contact with the organic film OL may be made of a metal compound of TaN; SiGe; scandium, yttrium, lanthanide or actinide of Group-IIIB; and Be, Mg, Ca, Sr, Ba or Ra of Group-II. Alternatively, the underlying layer UL may have a silicon-containing film in contact with the organic film OL.

The resist mask RM is provided on the organic film OL. The resist mask RM has a pattern that partially covers the organic film OL. The resist mask RM having this pattern is formed by a photolithography technique. Further, as will be described later, the organic film OL is etched such that the pattern of the resist mask RM is transcribed thereto. The organic film OL and the resist mask RM are made of similar organic materials. Since, however, the resist mask RM needs to be left until the completion of the etching of the organic film OL, the resist mask RM may have a larger thickness than that of the organic film OL.

In the exemplary embodiment, the wafer W may additionally have a base region BR. The base region BR is provided with a multiple number of protruding regions R1. These protruding regions R1 are arranged spaced apart from each other, and protruded higher than the other regions of the base region BR that form a surface of the base region BR. The surface of the base region BR, which is in contact with the underlying layer UL, includes surfaces of the protruding regions R1 and bottom surfaces R2S between the protruding regions R1. That is, the surface of the base region BR has an irregular shape.

As one example, the base region BR may be made of a silicon substrate provided with the protruding regions R1. Further, the base region BR may be also provided with buried regions R2 in addition to the protruding regions R1. The buried regions R2 are provided in grooves that are formed in the silicon substrate at both sides of each protruding region R1. The buried regions R2 may be made of, by way of non-limiting example, silicon oxide. Top surfaces of the buried regions R2 partially form the bottom surfaces R2S. A fin type field effect transistor may be produced from this example wafer W. Hereinafter, the method MT will be explained for the case of using the example wafer W shown in FIG. 2. However, it should be noted that the method MT can be applied to any of various kinds of processing target objects as long as they have an organic film on an underlying layer and a resist mask on the organic film.

Figure 3:
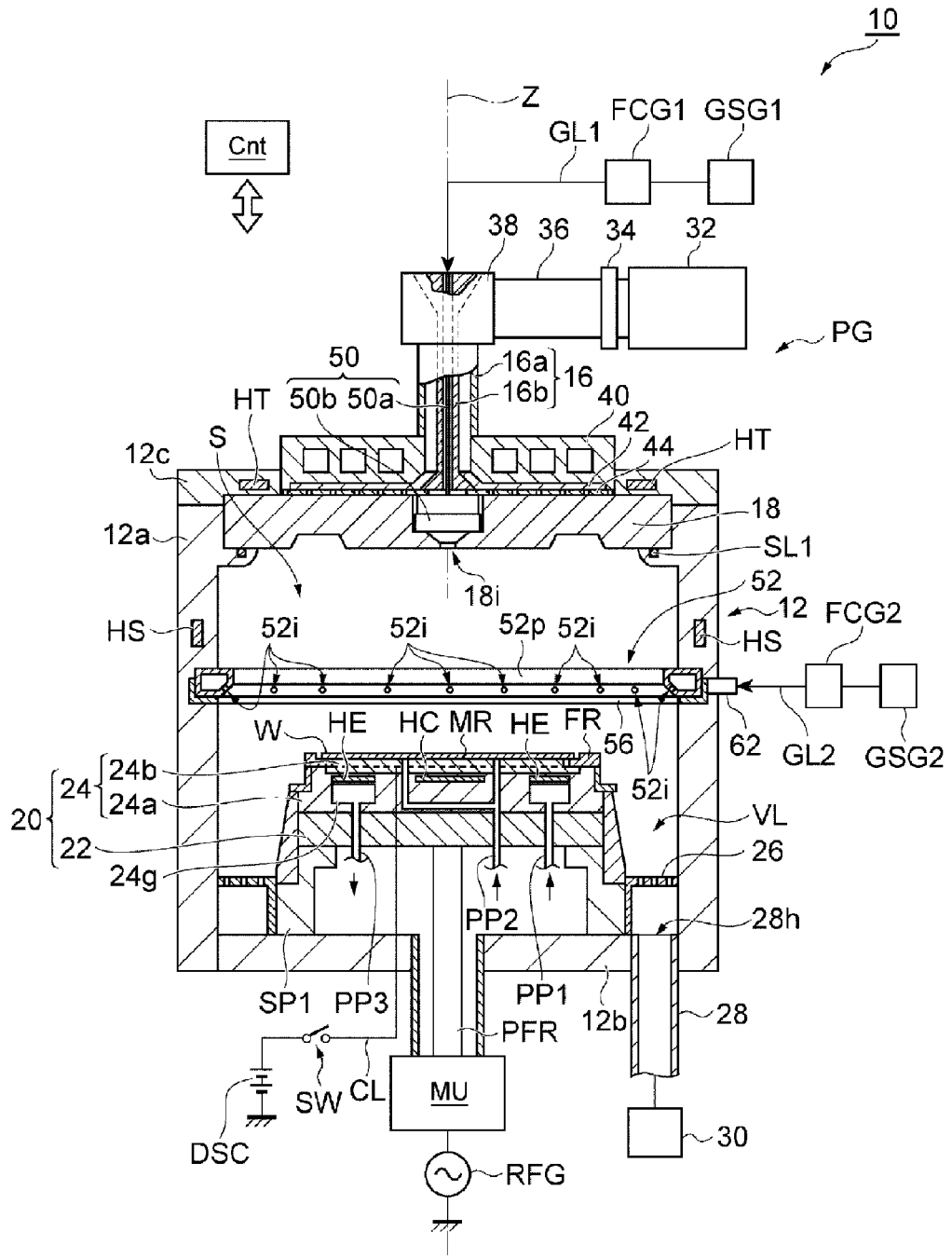
FIG. 3 is a diagram schematically illustrating a plasma processing apparatus in which the method described in FIG. 1 is performed.

Referring back to FIG. 1, at the process ST1, the wafer W is prepared and transferred into a processing vessel of a plasma processing apparatus in order to etch the organic film OL. FIG. 3 is a diagram schematically illustrating a plasma processing apparatus in which the method MT of FIG. 1 is performed. The plasma processing apparatus 10 shown in FIG. 3 is an example of a plasma processing apparatus configured to generate plasma by a surface wave which propagates on a surface of a dielectric window placed to face a mounting table configured to mount the wafer W thereon. In this apparatus, a microwave transmitted from a radial line slot antenna to the dielectric window is used as the surface wave, and the plasma is generated by the microwave.

The plasma processing apparatus includes a processing vessel 12. The processing vessel 12 is provided with a processing space S in which the wafer W is accommodated therein. The processing vessel 12 has a sidewall 12a, a bottom portion 12b and a ceiling portion 12c.

The sidewall 12a has an approximately cylindrical shape that is extended in a vertical direction. A central axis line of the sidewall 12a approximately coincides with a vertically extended axis line Z. The bottom portion 12b is provided at a lower end of the sidewall 12a, and an upper end of the sidewall 12a is opened. An upper end opening of the sidewall 12a is closed by a dielectric window 18. The dielectric window 18 is provided between the upper end of the sidewall 12a and the ceiling portion 12c. A sealing member SL1 may be provided between the dielectric window 18 and the upper end of the sidewall 12a. The sealing member SL1 may be, by way of non-limiting example, an O-ring, and it is configured to airtightly seal the processing vessel 12.

The plasma processing apparatus 10 is further equipped with a mounting table 20. The mounting table 20 is provided within the processing vessel 12. Provided above the mounting table 20 is the above-described dielectric window 18. The mounting table 20 includes a plate 22 and an electrostatic chuck 24.

The plate 22 is a substantially disk-shaped metallic member, and is made of, by way of non-limiting example, aluminum. The plate 22 is supported by a cylindrical supporting member SP1. The supporting member SP1 is vertically extended from the bottom portion 12b. The plate 22 serves as a lower electrode. The plate 22 is electrically connected via a matching unit MU and a power feed rod PFR to a high frequency power supply RFG configured to generate a high frequency bias power. The high frequency power supply RFG outputs a high frequency bias power having a regular frequency of, e.g., 13.56 MHz, suitable for controlling energy of ions attracted to the wafer W. The matching unit MU includes a matching device configured to match an impedance on the side of the high frequency power supply RFG and an impedance on a load side (mainly, electrode, plasma and the processing vessel 12). The matching device includes a blocking capacitor for a self-bias generation.

The electrostatic chuck 24 is provided on a top surface of the plate 22. The electrostatic chuck 24 includes a base plate 24a and a chuck member 24b. The base plate 24a is a substantially disk-shaped metallic member, and is made of, but not limited to, aluminum. The base plate 24a is provided on the plate 22, and the chuck member 24b is provided on a top surface of the base plate 24a.

A top surface of the chuck member 24b is configured as a mounting region MR for mounting the wafer W thereon. A center of the mounting region MR lies on the axis line Z. A distance between the mounting region MR and a surface of the dielectric window 18 at the side of the processing space is, for example, 245 mm. The chuck member 24b is configured to hold the wafer W thereon by an electrostatic attraction force. The chuck member 24b includes an electrode film embedded between dielectric films. The electrode film of the chuck member 24b is electrically connected to a DC power supply DSC via a switch SW and a coating line CL. The chuck member 24b is capable of holding the wafer W on the top surface thereof by a Coulomb force generated by a DC voltage applied from the DC power supply DSC. At an outside of the chuck member 24b in a radial direction thereof, a focus ring FR is provided to surround an edge of the wafer W.

Further, the plasma processing apparatus 10 is further equipped with a temperature control mechanism. As a part of the temperature control mechanism, a coolant path 24g is formed within the base plate 24a. A coolant is supplied into the coolant path 24g from a chiller unit through a pipeline PP1. The coolant supplied into the coolant path 24g is returned back into the chiller unit through a pipeline PP3. Further, a heat transfer gas from a heat transfer gas supply unit, e.g., a He gas is supplied into a gap between the top surface of the chuck member 24b and a rear surface of the wafer W through a pipeline PP2.

Furthermore, the plasma processing apparatus 10 also includes heaters HT, HS, HC and HE as a part of the temperature control mechanism. The heater HT is provided within the ceiling portion 12c. The heater HS is provided within the sidewall 12a. The heater HC is provided within the base plate 24a. Specifically, within the base plate 24a, the heater HC is provided under a central portion of the aforementioned mounting region MR, i.e., at a position where it intersects with the axis line Z. Further, the heater HE is provided within the base plate 24a and annularly extended to surround the heater HC. The heater HE is provided under a peripheral portion of the aforementioned mounting region MR.

In addition, an annular gas exhaust path VL is formed around the mounting table 20, i.e., between the mounting table 20 and the sidewall 12a of the processing vessel 12. An annular baffle plate 26 provided with a multiple number of through holes is provided at a midway position of the gas exhaust path VL in the direction of the axis line Z. The gas exhaust path VL is connected to a gas exhaust line 28 which is provided with a gas exhaust opening 28h. The gas exhaust line 28 is provided at the bottom portion 12b of the processing vessel 12 and is connected to a gas exhaust device 30. The gas exhaust device 30 includes a pressure controller and a vacuum pump such as a turbo molecular pump. The gas exhaust device 30 is configured to depressurize the processing space S within the processing vessel 12 to a required vacuum level. Further, by operating the gas exhaust device 30, a gas can be exhausted from a space around the mounting table 20 through the gas exhaust path VL.

In the exemplary embodiment, the plasma processing apparatus 10 further includes an antenna 44 and a microwave generator 32. The plasma processing apparatus 10 also includes a coaxial waveguide 16, a tuner 34, a waveguide 36, a mode converter 38, a dielectric plate 42 and a cooling jacket 40.

The microwave generator 32 is configured to generate a microwave having a frequency of, e.g., about 2.45 GHz to be supplied to the antenna 44. The microwave generator 32 is connected to an upper portion of the coaxial waveguide 16 via the tuner 34, the waveguide 36 and the mode converter 38. The coaxial waveguide 16 is vertically extended, and its central axis line substantially coincides with the axis line Z.

The coaxial waveguide 16 includes an outer conductor 16a and an inner conductor 16b. Each of the outer conductor 16a and the inner conductor 16b have cylindrical shapes sharing the axis line Z as a central axis line. A lower end of the outer conductor 16a may be electrically connected to an upper portion of the cooling jacket 40 having a conductive surface. The inner conductor 16b is provided within the outer conductor 16a to be coaxially arranged with the outer conductor 16a. A lower end of the inner conductor 16b is connected to the antenna 44.

In the exemplary embodiment, the antenna 44 is configured as the radial line slot antenna. The antenna 44 is provided at the opening formed in the ceiling portion 12c and is placed on a top surface of the dielectric window 18.

A dielectric plate 42 is provided on the antenna 44. The dielectric plate 42 is configured to shorten a wavelength of a microwave, and substantially has a disk shape. The dielectric plate 42 may be made of, but not limited to, quartz or alumina. The dielectric plate 42 is provided between the antenna 44 and a bottom surface of the cooling jacket 40.

Figure 4:
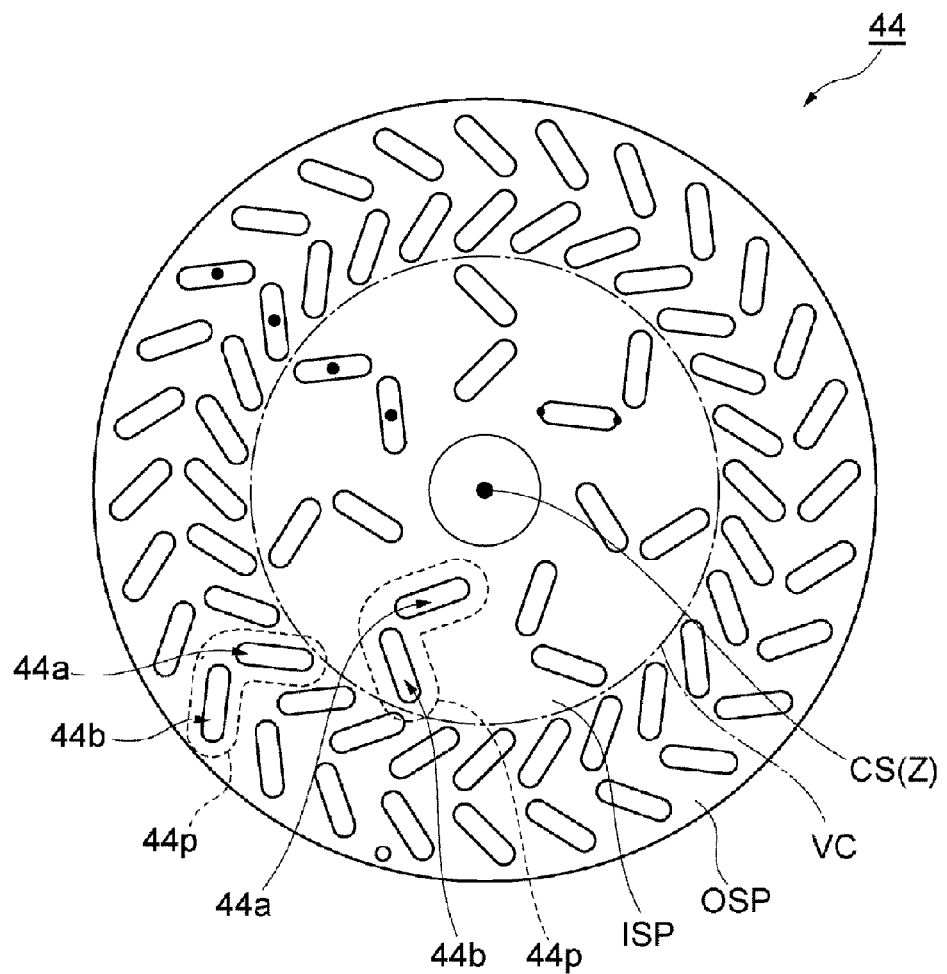
FIG. 4 is a plan view illustrating an example antenna.

FIG. 4 is a plan view illustrating an example of the antenna. The antenna 44 has a thin circular plate shape. A center CS of the antenna 44 lies on the axial line Z. The antenna 44 has a multiple number of slot pairs 44p. Each slot pair 44p includes two slot holes 44a and 44b formed through the antenna 44 in a plate thickness direction thereof. When viewed from the top, each of the slot holes 44a and 44b has an elongated hole shape. In each slot pair 44p, an extension direction of a long axis of the slot hole 44a and an extension direction of a long axis of the slot hole 44b may intersect each other or may be orthogonal to each other. In the example shown in FIG. 4, the multiple number of slot pairs 44b are divided into an inner slot pair group ISP located inside an imaginary circle VC centered on the axial line Z; and an outer slot pair group OPS located outside the imaginary circle VC. In the example shown in FIG. 4, the inner slot pair group ISP includes seven (7) slot pairs 44p, and the outer slot pair group OSP includes twenty eight (28) slot pairs 44p. Here, however, the number of the slot pairs of the inner slot group ISP and the number of the slot pairs of the outer slot group OSP are not limited to the shown example. By way of non-limiting example, the inner slot pair group ISP may have seven (7) slot pairs 44p, and the outer slot pair group OSP may have fourteen (14) slot pairs 44p.

Referring back to FIG. 3, in the plasma processing apparatus 10, the microwave in a TE mode is propagated from the microwave generator 32 to the mode converter 38 through the waveguide 36. The mode converter 38 is configured to convert the TE mode of the microwave into a TEM mode. The microwave in the TEM mode is propagated through the coaxial waveguide 16 and the dielectric plate 42, and then, is propagated to the dielectric window 18 from the slot holes 44a and 44b.

The plasma processing apparatus 10 includes a central supply unit 50 and a peripheral supply unit 52. The central supply unit 50 includes a pipe 50a, an injector 50b and a central inlet opening 18i. The pipe 50a is provided into a hole within the inner conductor 16b of the coaxial waveguide 16. An end portion of the pipe 50a is extended into a space formed in the dielectric plate 18 along the axial line Z. The injector 50b is accommodated within this space to be located under the end portion of the pipe 50a. The injector 50b is provided with a multiple number of through holes extended in the direction of the axial line Z. Further, the dielectric window 18 also has the central inlet opening 18i, which is extended downwards from the space, in which the injector 50b is accommodated, along the axial line Z. The central supply unit 50 having this configuration is configured to supply a gas to the injector 50b through the pipe 50a and discharge the gas from the injector 50b through the central inlet opening 18i. Accordingly, the central supply unit 50 discharges the gas to a space directly under the dielectric window 18 along the axial line Z. That is, the central supply unit 50 introduces the gas into a plasma generation region having a high electron temperature. This central supply unit 50 mainly creates a gas flow toward a center of the wafer W.

The peripheral supply unit 52 is provided with a plurality of peripheral inlet openings 52i. A gas is supplied to an edge region of the wafer W through these peripheral inlet openings 52i. The peripheral inlet openings 52i are opened toward the edge region of the wafer W or toward a peripheral portion of the mounting region MR. The peripheral inlet openings 52i are arranged in a circumferential direction under the central inlet opening 18i and above the mounting table 20. That is, the peripheral inlet openings 52i are annularly arranged around the axial line Z in a region (plasma diffusion region) where an electron temperature is lower than an electron temperature in the region directly under the dielectric window 18. This peripheral supply unit 52 is configured to supply a gas toward the wafer W from the region having the lower electron temperature. Accordingly, the degree of dissociation of the gas introduced into the processing space S from the peripheral supply unit 52 is lower than the degree of dissociation of the gas introduced into the processing space S from the central supply unit 50.

In the exemplary embodiment, the peripheral supply unit 52 has an annular pipe 52p. This annular pipe 52p is provided with multiple peripheral inlet openings 52i, and is made of, but not limited to, quartz. In the exemplary embodiment, the annular pipe 52p is provided along an inner wall surface of the sidewall 12a.

The central supply unit 50 is connected to a first gas source group GSG1 via a first flow rate control unit group FCG1. Further, the peripheral supply unit 52 is connected to a second gas source group GSG2 via a second flow rate control unit group FCG2.

The first gas source group GSG1 includes multiple gas sources. The multiple gas sources belonging to the first gas source group GSG1 include a source of a hydrogen gas ($H_2$ gas) and a source of a nitrogen gas ($N_2$ gas). The first flow rate control unit group FCG1 includes multiple flow rate control units. Each flow rate control unit includes, for example, two valves and a flow rate controller provided between the two valves. The flow rate controller is implemented by, for example, a mass flow controller. Each of the multiple gas sources belonging to the first gas source group GSG1 is connected to the central supply unit 50 via each corresponding one of the multiple flow rate control units of the first flow rate control unit group FCG1.

The second gas source group GSG2 includes multiple gas sources. The multiple gas sources belonging to the second gas source group GSG2 include a source of a hydrogen gas ($H_2$ gas) and a source of a nitrogen gas ($N_2$ gas). The second flow rate control unit group FCG2 includes multiple flow rate control units. Each flow rate control unit includes, for example, two valves and a flow rate controller provided between the two valves. The flow rate controller is implemented by, for example, a mass flow controller. Each of the multiple gas sources belonging to the second gas source group GSG2 is connected to the peripheral supply unit 52 via each corresponding one of the multiple flow rate control units of the second flow rate control unit group FCG2.

Furthermore, the plasma processing apparatus 10 may has a single gas source group and a single flow rate control unit group instead of the two gas source groups and the two flow rate control unit groups, i.e., the first and second gas source groups GSG1 and GSG2, and the first and second flow rate control unit groups FCG1 and FCG2. In such a configuration, a gas from the singe gas source group may be distributed to the central supply unit 50 and the peripheral supply unit 52 by a gas splitter.

In addition, the plasma processing apparatus 10 further includes a control unit Cnt. The control unit Cnt may be a control device such as a programmable computer device. The control unit Cnt is configured to control individual components of the plasma processing apparatus 10 according to programs based on recipes.

In this plasma processing apparatus 10, a processing gas is supplied into the processing vessel 12 from the central supply unit 50 and the peripheral supply unit 52. Further, a microwave is propagated to the dielectric window 18 as stated above, and propagated to the surface of the dielectric window 18 at the side of the processing space S. Accordingly, the processing gas is excited directly under the dielectric window 18, and high-density plasma is generated directly under the dielectric window 18. Hydrogen radicals and nitrogen radicals in the generated plasma are moved toward the wafer W, which is provided under the dielectric window 18 while being spaced apart therefrom, along a flow of the gas discharged from the central and peripheral supply units 50 and 52 and a flow of the gas which is exhausted. That is, there is created a flow of the hydrogen radicals and the nitrogen radicals moving downwards in a substantially vertical direction toward the wafer W. Accordingly, active species mainly containing radicals are supplied to the wafer W. Furthermore, hydrogen ions and nitrogen ions in the plasma are attracted in the vertically downward direction toward the wafer W by the high frequency bias power supplied to the lower electrode of the mounting table 20. As a result, the organic film OL of the wafer W is etched by these active species supplied to the wafer W.

Now, referring back to FIG. 1, the method MT will be further described in a case where the plasma processing 10 is used to perform the method MT. As explained above, in the process ST1, the wafer W is accommodated in the processing vessel 12 of the plasma processing apparatus 10, and then placed and held on the mounting table 20.

Subsequently, in the process ST2, the organic film OL is etched. At this process ST2, the processing gas containing the hydrogen gas and the nitrogen gas is supplied into the processing vessel 12. The processing gas may be supplied from both or either one of the central supply unit 50 and the peripheral supply unit 52. Further, the space within the processing vessel 12 is depressurized by the gas exhaust device 30. Then, the plasma of the processing gas is generated by the microwave that propagates on the surface of the dielectric window 18.

In the process ST2, a flow rate ratio of the hydrogen gas to a total flow rate of the processing gas supplied into the processing vessel 12 is set to be in a range from 35% to 75%. Accordingly, the organic film OL can be etched with a high selectivity against the underlying layer UL. Further, the organic layer OL can be etched at a high etching rate. Thus, it is possible to etch the organic film OL while suppressing damage on the underlying layer UL, i.e., while suppressing the etching of the underlying layer UL.

Also, in the process ST2, the high frequency bias power supplied to the lower electrode of the mounting table 20 from the high frequency power supply RFG is set to be in a range from 50 W to 135 W. That is, the high frequency bias power for attracting ions to the wafer W is supplied to the mounting table 20, though a power level thereof is low. Accordingly, the etching of the organic film OL in the vertical direction can be accelerated, and the organic film OL can be etched at a high etching rate. In addition, since the high frequency bias power has the relatively low power level, it is possible to achieve a high selectivity for the organic film OL against the underlying layer UL, so that the organic film OL can be etched while suppressing damage on the underlying layer UL. In the process ST2, the high frequency bias power may be set to be higher than 0 W and lower than 50 W.

In the exemplary embodiment, in the process ST2, an internal pressure of the processing vessel 12 is set to be in the range from 6.666 Pa (50 mTorr) to 26.66 Pa (200 mTorr). That is, the inside of the processing vessel 12 is set to be under a high pressure. In this high-pressure environment, ion energy is lowered. Thus, the damage on the underlying layer UL can be further suppressed. These settings of the flow rate of the processing gas, the internal pressure of the processing vessel 12 and the high frequency bias power are implemented by controlling the first and second flow rate control unit groups FCG1 and FCG2, the gas exhaust device 30 and the high frequency power supply RFG under the control of the control unit Cnt. To perform the process ST2, the control unit Cnt may control individual components of the plasma processing apparatus 10 including the microwave generator 32, the heaters, and so forth.

Figure 5:
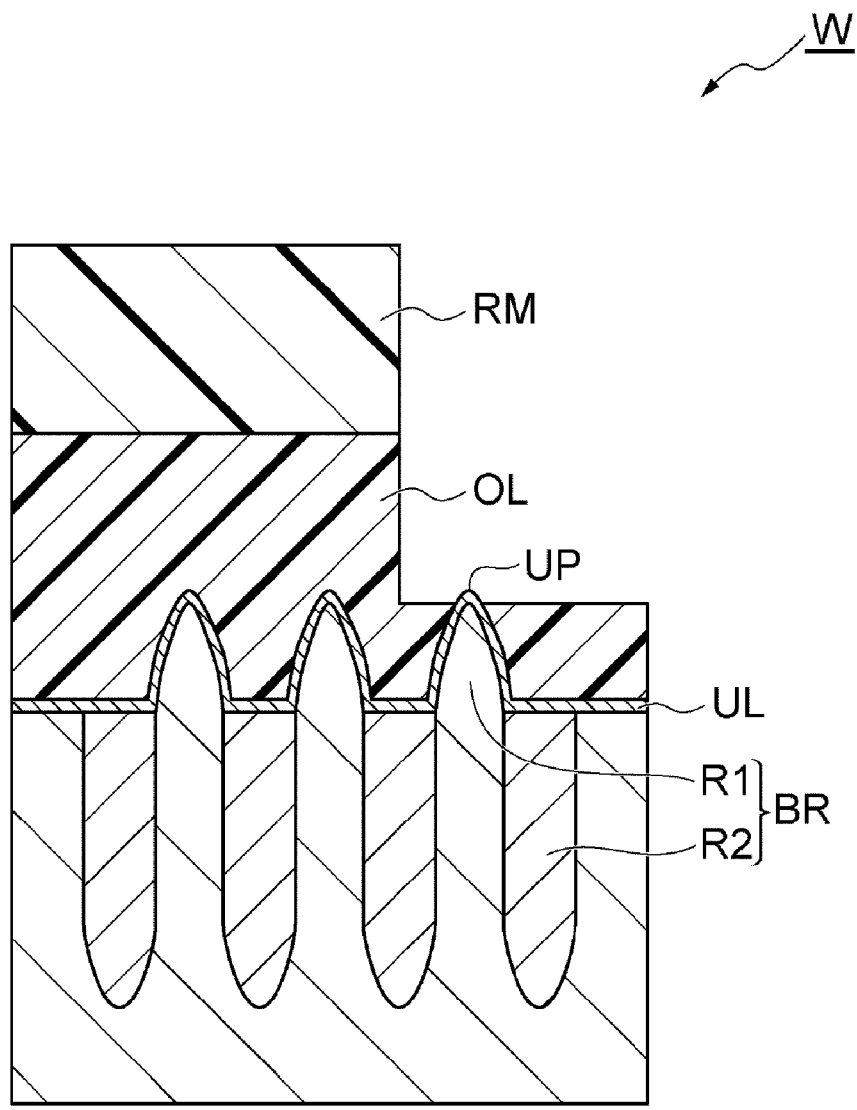
FIG. 5 is a diagram showing a state of the example processing target object in the middle of a process ST2.
Figure 6:
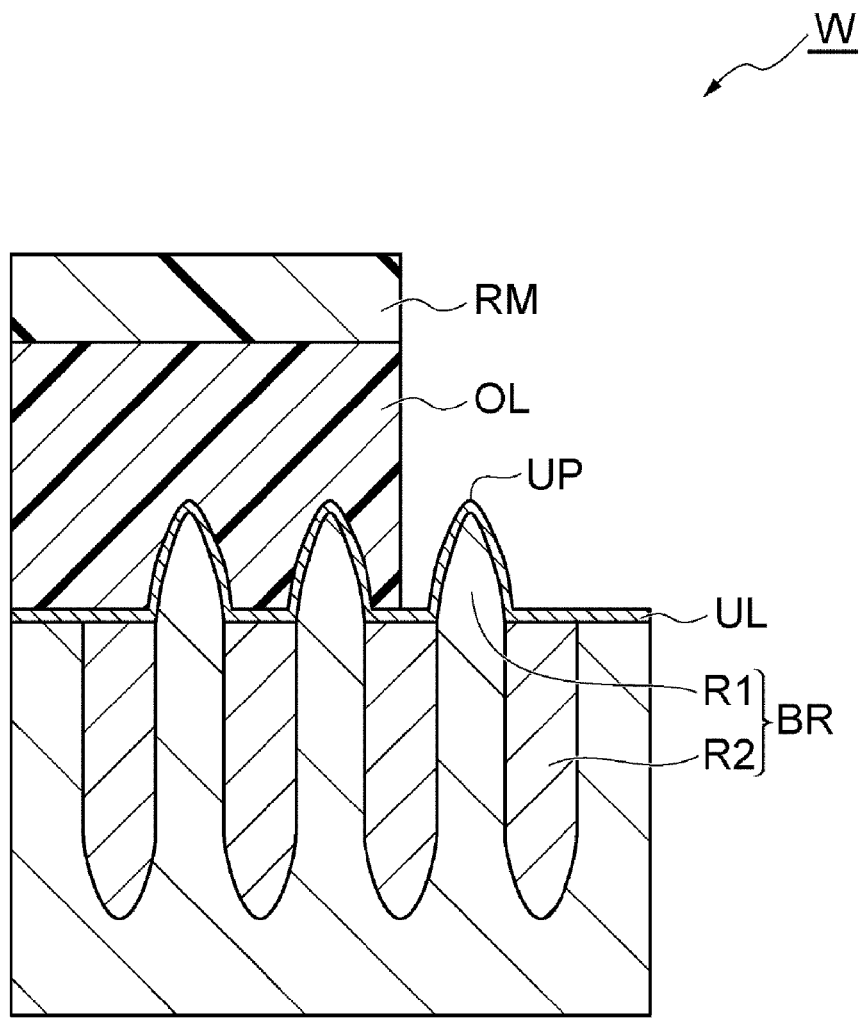
FIG. 6 is a diagram showing a state of the example processing target object upon the completion of the process ST2.

FIG. 5 and FIG. 6 are diagrams showing a state of the wafer W in the middle of the process ST2 and a state of the wafer W upon the completion of the process ST2, respectively. When the process ST2 is performed, a region of the organic film OL which is not covered with the resist mask RM is etched. As depicted in FIG. 5, with a lapse of a processing time of the process ST2, the underlying layer UL is exposed starting from a portion UP extended from a top portion of the protruding portion R1, in the entire region of the underlying layer UL. As depicted in FIG. 6, the etching in the process ST2 is performed until the organic film OL which is not covered with the resist mask RM is completely removed. Accordingly, in the etching of the organic film OL of the wafer W shown in FIG. 2, the portion UP extended from the top portion of the protruding portion R1 is exposed to the active species originated from the processing gas for the longest time. In the method MT, however, since conditions for selectively etching the organic film OL against the underlying layer UL are selected, damage on the underlying layer UL, i.e., the etching of the underlying layer UL caused by etching the organic film OL can be suppressed. Furthermore, the selectivity of etching for the organic film OL against the underlying layer UL may be equal to or higher than 74.

As described above, in the method MT, the high frequency bias power is supplied to the lower electrode, though the power level thereof is low, and there is formed the radical flow as described above. Therefore, the organic film OL can be etched substantially vertically, as depicted in FIG. 6.

Hereinafter, experimental examples regarding the method MT will be described. However, it should be noted that the experimental examples are not intended to be anyway limiting.

Experimental Example 1

In an experimental example 1, the process ST2 is performed on the wafer W shown in FIG. 2 by using the plasma processing apparatus 10 under the following processing conditions. In the experimental example 1, a ratio (%) of the flow rate of the hydrogen gas ($H_2$ gas) to the total flow rate of the processing gas containing the nitrogen gas ($N_2$ gas) and the hydrogen gas ($H_2$ gas) is varied in various ways.

<Processing Conditions For Process ST2>

Internal pressure of processing vessel: 50 mTorr (6.666 Pa)

Microwave power: 2000 W

High frequency bias power: 150 W

Figure 7A:
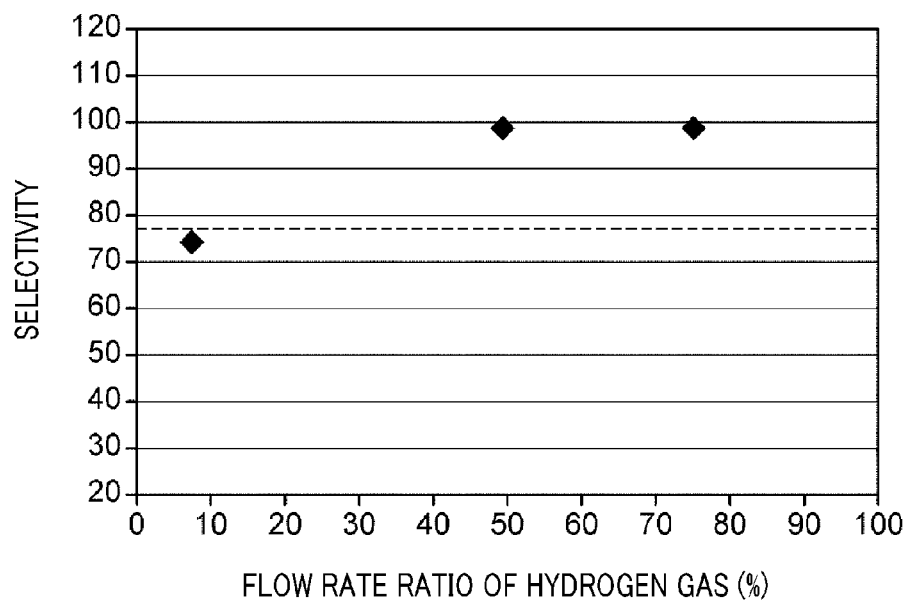
FIG. 7A and FIG. 7B are graphs showing a result of an experimental example 1.
Figure 7B:
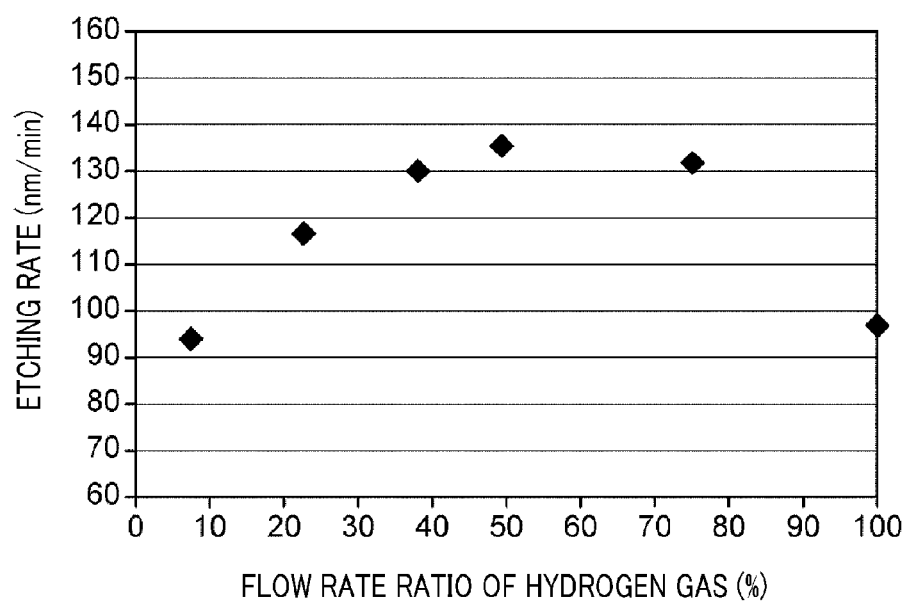

An etching rate of the organic film OL is calculated by dividing a thickness T (see FIG. 2) of the organic film OL downwards from the portion UP by a time period from a time point when the portion UP is first exposed to a time point when the organic film OL is completely etched. Further, a selectivity of etching the organic film OL against the underlying layer UL is calculated by dividing the thickness T by an etched amount (nm) of the portion UP in the vertical direction for the corresponding time period. FIG. 7A depicts a graph showing the selectivity obtained in the experimental example 1, and FIG. 7B presents a graph showing the etching rate obtained in the experimental example 1. On the graphs of FIG. 7A and FIG. 7B, a horizontal axis represents the flow rate ratio of the hydrogen gas to the processing gas. On the graphs of FIG. 7A and FIG. 7B, vertical axes indicate the selectivity and the etching rate, respectively.

A dashed line in FIG. 7A indicates a selectivity of 74. As can be seen from FIG. 7A, a selectivity of 74 or higher is obtained when the flow rate ratio of the hydrogen gas is 50% and 75%. Further, as shown in FIG. 7B, it is found that a high etching rate of 130 nm/min or higher as the etching rate of the organic film OL is obtained when the flow rate ratio of the hydrogen gas is in the range from 35% to 75%. Furthermore, in view of the result that the etching rate when the flow rate ratio of the hydrogen gas is 35% is equal to the etching rates when the flow rate ratios of the hydrogen gas are 50% and 75%, it is deemed that the same level of selectivity as obtained when the flow rate ratio of the hydrogen gas is 50% or 75% is achieved even when the flow rate ratio of the hydrogen gas is 35%. Thus, it is found that when the flow rate ratio of the hydrogen gas to the flow rate of the processing gas is in the range from 35% to 75%, the organic film OL can be etched with the high selectivity and with the high etching rate.

Experimental Example 2

Figure 8A:
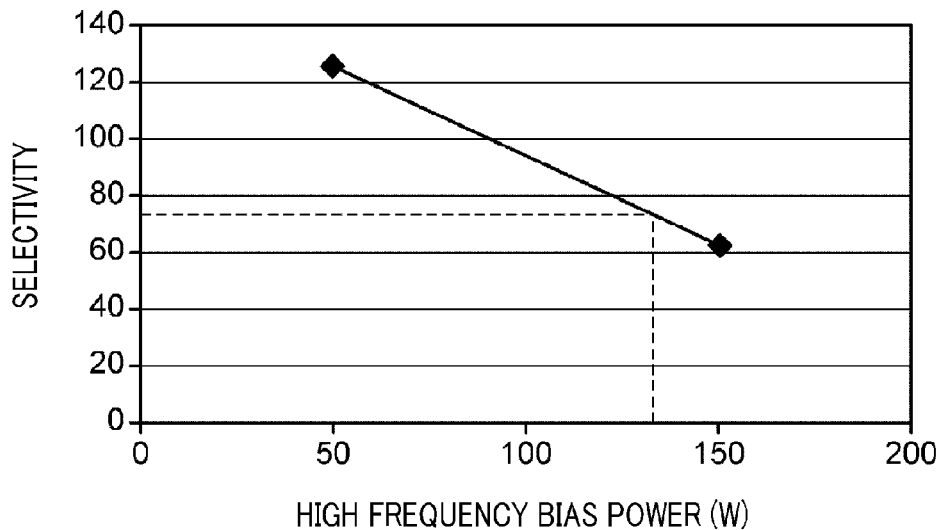
FIG. 8A and FIG. 8B are graphs showing a result of an experimental example 2.
Figure 8B:
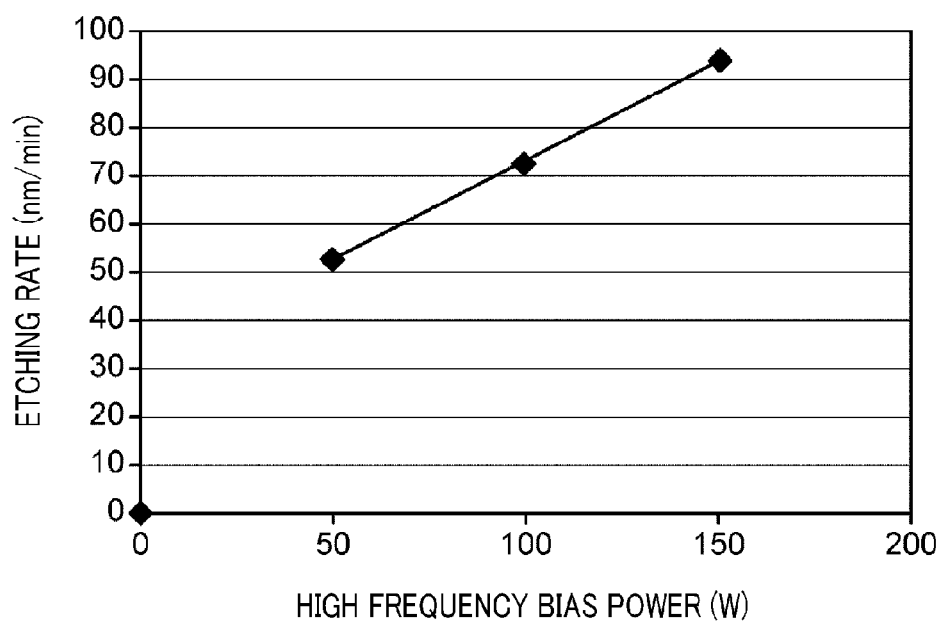

In an experimental example 2, the process ST2 is performed on the wafer W shown in FIG. 2 by using the plasma processing apparatus 10 under the following processing conditions. In the experimental example 2, the high frequency bias power is varied in various ways.
<Processing Conditions for Process ST2>
Internal pressure of processing vessel: 50 mTorr (6.666 Pa)
Microwave power: 2000 W
Nitrogen gas flow rate: 300 sccm
Hydrogen gas flow rate: 25 sccm
As in the experimental example 1, the etching rate of the organic film OL and the selectivity of etching the organic film OL against the underlying layer UL are calculated. FIG. 8A depicts a graph showing the selectivity obtained in the experimental example 2, and FIG. 8B presents a graph showing the etching rate obtained in the experimental example 2. On the graphs of FIG. 8A and FIG. 8B, a horizontal axis represents the high frequency bias power. On the graphs of FIG. 8A and FIG. 8B, vertical axes indicate the selectivity and the etching rate, respectively.
As can be seen from the graph of FIG. 8B, when the high frequency bias power is in the range from 50 W to 150 W, the etching rate of the organic film OL increases linearly depending on the magnitude of the high frequency bias power. Accordingly, it is deemed that the selectivity decreases substantially linearly depending on the magnitude of the high frequency bias power when the high frequency bias power is in the range from 50 W to 150 W. Referring to the graph of FIG. 8A from this point of view, a selectivity of 74 (see a horizontal dashed line on the graph of FIG. 8A) is found to be obtained when the high frequency bias power is in the range from 50 W to 135 W (see a vertical dashed line on the graph of FIG. 8A). Thus, it is found that the organic film OL can be etched with the high selectivity against the underlying layer UL by applying the high frequency bias power ranging from 50 W to 135 W.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. By way of example, in the above-described exemplary embodiment, the plasma processing apparatus 10 is used to perform the method MT. However, various other types of plasma processing apparatuses such as a capacitively coupled plasma processing apparatus and an inductively coupled plasma processing apparatus can be utilized.

We claim:
1. A method of etching an organic film, comprising:
preparing a processing target object having a base region provided with a plurality of protruding regions spaced apart from each other, an underlying layer formed on a surface of the base region, an organic film formed on the underlying layer, and a resist mask which is formed on the organic film such that the organic film is partially exposed, the surface of the base region including surfaces of the plurality of protruding regions and bottom surfaces between the plurality of protruding regions; and
selectively etching the organic film against the underlying layer within a processing vessel of a plasma processing apparatus which accommodates the processing target object therein so that the underlying layer is exposed starting from a portion extended from a top portion of the protruding regions, in an entire region of the underlying layer while the etching of the underlying layer is suppressed,
wherein a processing gas containing a hydrogen gas and a nitrogen gas is supplied into the processing vessel,
plasma of the processing gas is generated,
a flow rate ratio of the hydrogen gas to a flow rate of the processing gas is set to be in a range from 35% to 75%, and
a bias power for ion attraction to the processing target object is set to be in a range from 50 W to 135 W in the etching of the organic film.
2. The method of claim 1,
wherein an internal pressure of the processing vessel is set to be in a range from 6.666 Pa to 26.66 Pa in the etching of the organic film.
3. The method of claim 1,
wherein the underlying layer includes a metal film in contact with the organic film.
4. The method of claim 3,
wherein the metal film contains titanium nitride.
5. The method of claim 1,
wherein the underlying layer includes a silicon-containing film in contact with the organic film.
6. The method of claim 1,
wherein the plasma is generated by a surface wave propagating on a surface of a dielectric window which is in contact with a space within the processing vessel and arranged to face a mounting table configured to hold the processing target object thereon.
7. The method of claim 1,
wherein the plasma is generated by a microwave propagating on a surface of a dielectric window which is in contact with a space within the processing vessel and arranged to face a mounting table configured to hold the processing target object thereon, and
the microwave is transmitted to the dielectric window from a radial line slot antenna.
8. The method of claim 1,
wherein the organic film is etched against the underlying layer with a selectivity of 74.

* * * * *